US012644927B2

(12) United States Patent
Tortora et al.

(10) Patent No.: US 12,644,927 B2
(45) Date of Patent: Jun. 2, 2026

(54) INTEGRATED CIRCUIT COMPRISING A TEST CIRCUIT, RELATED METHOD AND COMPUTER-PROGRAM PRODUCT

(71) Applicant: STMicroelectronics International N.V., Geneva (CH)

(72) Inventors: Gianluca Tortora, Legnano (IT); Mario Barone, Gorgonzola (IT)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/590,333

(22) Filed: Feb. 28, 2024

(65) Prior Publication Data

US 2024/0295604 A1 Sep. 5, 2024

(30) Foreign Application Priority Data

Mar. 3, 2023 (IT) ........................ 102023000003870

(51) Int. Cl.
| | |
|---|---|
| *G01R 31/3185* | (2006.01) |
| *G06F 30/333* | (2020.01) |
| *G11C 29/32* | (2006.01) |

(52) U.S. Cl.
CPC ............... *G01R 31/318536* (2013.01); *G01R 31/318541* (2013.01); *G06F 30/333* (2020.01); *G11C 29/32* (2013.01); *G11C 2029/3202* (2013.01)

(58) Field of Classification Search
CPC .... G01R 31/318536; G01R 31/318541; G06F 30/333; G11C 29/32; G11C 2029/3202
See application file for complete search history.

(56) References Cited

U.S. PATENT DOCUMENTS

| | | | |
|---|---|---|---|
| 5,428,624 A | 6/1995 | Blair et al. | |
| 8,745,456 B2 | 6/2014 | Whetsel | |
| 8,996,939 B2 | 3/2015 | Casarsa | |
| 9,869,718 B1 | 1/2018 | H et al. | |
| 2004/0165071 A1 | 8/2004 | Kashiwagi | |
| 2010/0174956 A1* | 7/2010 | Kawasaki ...... | G01R 31/318555 |
| | | | 714/E11.155 |
| 2023/0141786 A1* | 5/2023 | Son ................ | G01R 31/318597 |
| | | | 714/726 |

OTHER PUBLICATIONS

IT Search Report and Written Opinion for priority application, IT Appl. No. 102023000003870, report dated Sep. 21, 2023, 6 pgs.

* cited by examiner

*Primary Examiner* — Cynthia Britt
(74) *Attorney, Agent, or Firm* — Crowe & Dunlevy LLC

(57) ABSTRACT

An integrated circuit includes a sequential logic circuit and a circuit configured to change operation as a function of state output signals provided by state flip-flops of the sequential logic circuit. With a test mode signal asserted, a test circuit writes and reads the content of the state flip-flops in order to test the operation of the sequential logic circuit. A processing system includes at least one storage circuit interposed between the circuit and a respective state output signal. Each storage circuit receives the respective state output signal and provides a modified state signal to the circuit. When the test mode signal is de-asserted, the storage circuit provides the received state output signal in a transparent manner to the circuit and stores the received state output signal to a storage element. When the test mode signal is asserted, the storage circuit provides the stored state output signal to the circuit.

24 Claims, 8 Drawing Sheets

INTEGRATED CIRCUIT COMPRISING A TEST CIRCUIT, RELATED METHOD AND COMPUTER-PROGRAM PRODUCT

PRIORITY CLAIM

This application claims the priority benefit of Italian Application for Patent No. 102023000003870 filed on Mar. 3, 2023, the content of which is hereby incorporated by reference in its entirety to the maximum extent allowable by law.

TECHNICAL FIELD

Embodiments of the present disclosure relate to solutions for testing integrated circuits.

BACKGROUND

Integrated circuit are commonly tested via scan tests and/or boundary scan tests. For example, such solutions are disclosed in IEEE standard 1149.1 or U.S. Pat. Nos. 5,428, 624, 8,996,939 or 8,745,456, which are incorporated herein by reference.

There is a need in the art to provide improved solutions for testing integrated circuits.

SUMMARY

One or more embodiments concerns an integrated circuit. Embodiments moreover concern a related method, as well as a corresponding computer program product, which can be loaded into the memory of at least one computer and comprises portions of software code for implementing the steps of the method when the product is run on a computer. As used herein, reference to such a computer program product is understood as being equivalent to reference to a computer-readable means containing instructions for controlling a processing system in order to co-ordinate execution of the method. Reference to "at least one computer" is clearly intended to highlight the possibility of the present disclosure being implemented in a distributed/modular way.

As mentioned above, various embodiments of the present disclosure relate to an integrated circuit. The integrated circuit comprises a sequential logic circuit comprising a plurality of state flip-flops, wherein each state flip-flop is configured to generate a state output signal by storing an input signal in response to a clock signal, whereby the state flip-flops provide a state signal of the sequential logic circuit. A next-state combinational logic circuit is configured to generate the input signals for the state flip-flops as a function of the state output signals of the state flip-flops and at least one input signal. In various embodiments, a circuit is configured to change operation as a function of a subset of the state output signals provided by the state flip-flips. For example, the circuit may be a combinational logic circuit generating output signals of the sequential logic circuit, or the circuit may comprise an analog circuit configured to change operation as a function of the state signals.

According to the present disclosure, the integrated circuit comprises also a test circuit configured to determine whether a test mode signal is asserted. In response to determining that the test mode signal is asserted, the test circuit writes and reads the content of the plurality of state flip-flops in order to test the operation of the sequential logic circuit.

For example, the test circuit may comprise a scan-chain. In this case, each state flip-flop forms part of a respective scan element, wherein a first scan element is configured to provide a serial input signal to the input of the respective state flip-flop when a scan mode enable signal is asserted. Moreover, the following scan elements are configured to provide the state output signal of the state flip-flop of a previous scan-element to the input of the respective state flip-flop when a scan mode enable signal is asserted. Finally, the state output signal of the state flip-flop of a last scan-element corresponds to serial output signal. For example, in this case, the test circuit may comprise a test port configured to assert the scan mode enable signal and apply sequentially data to the serial input signal in order to load data into the plurality of state flip-flops. Next, the test port de-asserts the scan mode enable signal, whereby the sequential logic circuit updates the content of the state flip-flops. Finally, the test port asserts again the scan mode enable signal, and sequentially reads the serial output signal in order to read the content of the plurality of state flip-flops. For this purpose, the test port may also generate the clock signal for the state flip-flops when the test mode signal is asserted.

Specifically, in various embodiments, the processing system comprises further at least one storage circuit. Each storage element is interposed between the circuit and a respective state output signal of the subset of state output signals, wherein each storage element is configured to receive the respective state output signal and provide a modified state signal to the circuit. Specifically, in response to determining that the test mode signal is de-asserted, the storage circuit provides the received state output signal in a transparent manner to the circuit and stores the received state output signal to a storage element of the storage circuit. Conversely, in response to determining that the test mode signal is asserted, the storage circuit does not update the storage element, i.e., inhibits storage of the received state output signal to the storage element, and provides the stored state output signal to the circuit.

For example, in various embodiments, the storage circuit comprises a flip-flop configured to store, in response to the clock signal, the respective received state output signal when the test mode signal is de-asserted. For this purpose, the storage circuit may comprise a first multiplexer configured to generate an input signal of the respective flip-flop by selecting the received state output signal when the test mode signal is de-asserted, and the output signal of the flip-flop when the test mode signal is asserted. Moreover, a second multiplexer may be configured to generate the modified state signal by selecting the received state output signal when the test mode signal is de-asserted, and the output signal of the flip-flop when the test mode signal is asserted.

In various embodiments, the storage circuit may thus ensure that given state signals do not change during the testing of the integrated circuit. Preferably, the disclosed mechanism is only used for a subset of the state signals, such as state signals used by power supplies, or voltage or current regulators. Accordingly, in various embodiments, the number of storage circuits is (significantly) smaller than the number of the state flip-flops.

In various embodiments, the previously mentioned scan elements may also be added automatically. For example, for this purpose, a software tool may obtain an RTL model of a digital circuit comprising (at least) the sequential logic circuit and the storage circuits. For example, the RTL model may be generated via a synthesis operation of a higher language model of the digital circuit.

Accordingly, in various embodiments, two types of flip-flops may be used: a first set of flip-flops forming part of the sequential logic circuit, and a second set of flip-flops used for the storage elements. In order to distinguish these flip-flops, the flip-flops of the storage circuits are preferably marked. Accordingly, in this way, the software tool may execute a series of operations for each flip-flop of the RTL mode. First, the software tool may determine whether the flip-flop is marked. In response to determining that the flip-flop is not marked, the software tool may replace the flip-flop with a scan element. Conversely, in response to determining that the flip-flop is marked, the software tool may not replace the flip-flop, i.e., may inhibit that the flip-flop is replaced with a scan element. Next, the software tool may connect the scan element in series in order to form one or more scan chains. Optionally, the software tool may also add a test port to the RTL model.

BRIEF DESCRIPTION OF THE DRAWINGS

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
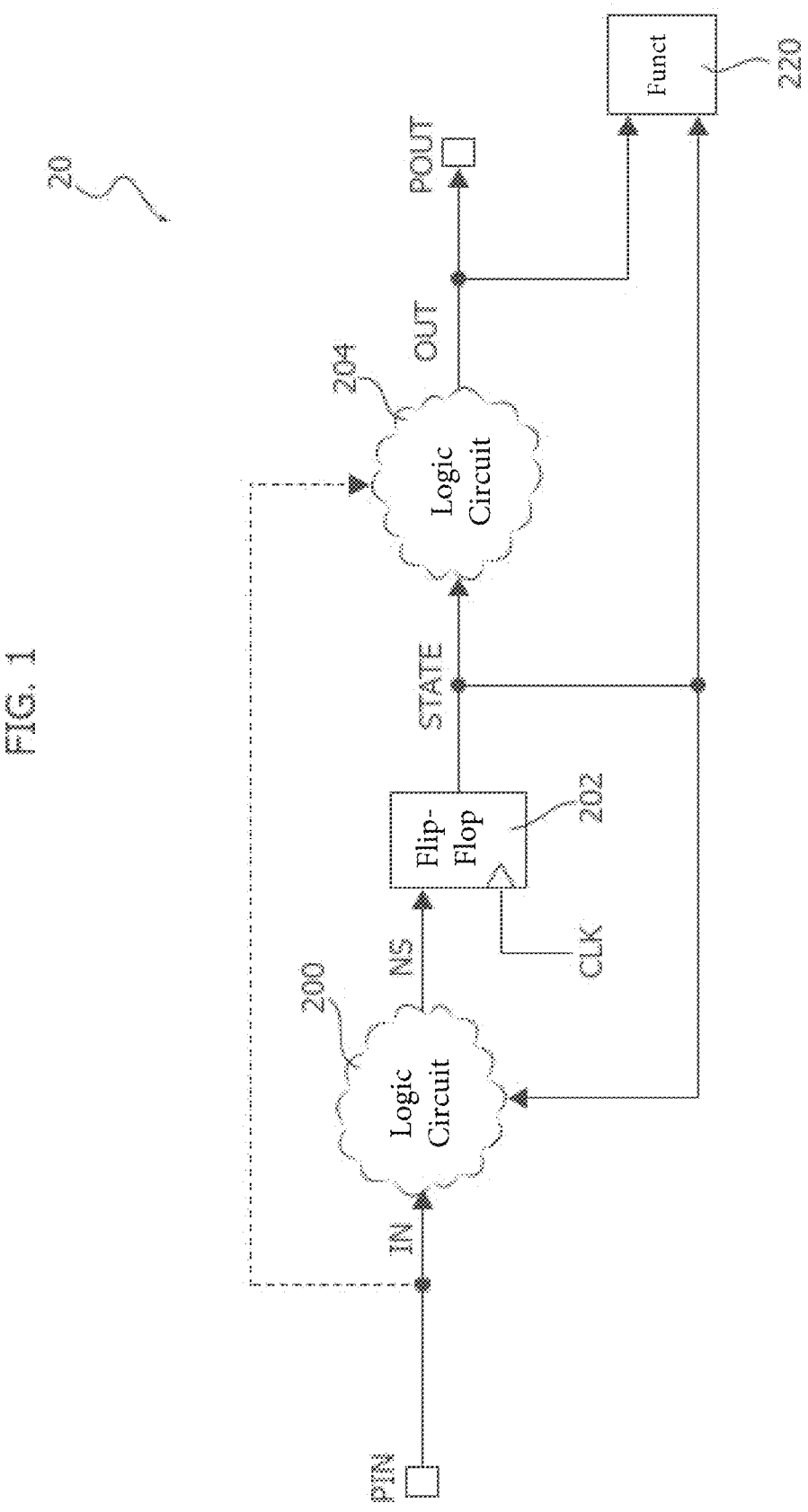
FIG. 1 shows a sequential logic circuit.

FIG. 1 shows a generic sequential logic circuit 20, e.g., implemented in an integrated circuit.

Specifically, a sequential logic circuit comprises a plurality of (internal) memory elements 202, usually implemented with flip-flops, which may be grouped into one or more registers. Specifically, these internal memory elements 202 store the internal state STATE of the sequential logic circuit 20.

The sequential logic circuit 20 comprises also a first combinational logic circuit 200 configured to generate a next state signal NS as a function of the state signal STATE and one or more input signals IN, e.g., received via respective pads of an integrated circuit die or pins of a packaged integrated circuit. Specifically, in response to a clock signal CLK, the internal memory elements 202 store the next state signal NS, thereby updating the state STATE.

Moreover, the sequential logic circuit 20 typically comprises a second combinational logic circuit 204 configured to generate one or more output signals OUT exclusively as a function of the state signal STATE (in case of a Moore state machine), or by combining the state signal STATE with the input signal IN (in case of a Mealy state machine—as indicated by the dotted arrow). Generally, the combinational logic circuit 204 is purely optional, because one or more of the output signals OUT could also correspond directly to a respective bit of the state signal STATE. For example, the output signal OUT may be provided to respective pads/pins POUT of the integrated circuit. Additionally, or alternatively, the signals OUT (or directly one or more of the state signals STATE) may be provided to a circuit 220, which may be integrated in the integrated circuit or connected externally to the pads/pins POUT. In general, the circuit (Funct) 220 may be an analog and/or digital circuit configured to change operation as a function of one or more of the received signals.

Figure 2:
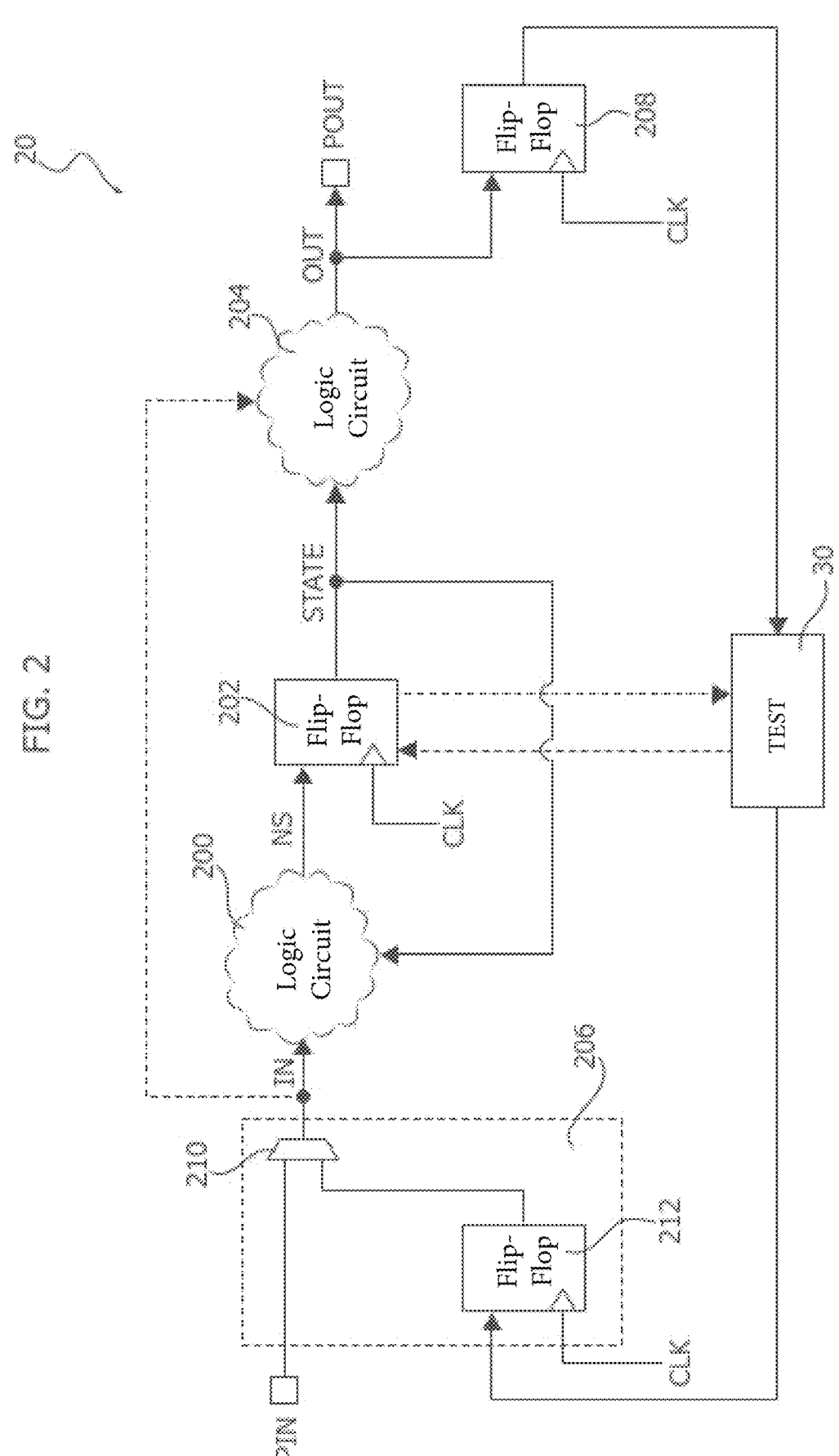
FIG. 2 shows a sequential logic circuit comprising a test circuit.

FIG. 2 shows an embodiment of a test circuit 30 configured to test the operation of the sequential logic circuit, in particular the operation of the combinational logic circuits 200 and 204.

Specifically, in order to test the operation of a combinational logic circuit, the test circuit 30 should be able to provide input signals to the combinational logic circuit, and monitor the output signals generated by the combinational logic circuit.

For example, with respect to the combinational logic circuit 200, the test circuit 30 should be able to provide the signals IN and STATE to the combinational logic circuit 200. For example, concerning the signal STATE, the test circuit 30 may be configured to read/monitor and modify/write the content of the memory elements/flip-flops 202. Conversely, concerning the signal IN, the test circuit 30 may either apply externally signals to the pads/pins PIN, or the system 20 may comprise a circuit 206 configured to set the input signals IN based on signals received from the test circuit 30. For example, in FIG. 2, the system comprises for each signal IN a respective circuit 206, which in turn comprises a multiplexer 210 and an optional flip-flop 212, wherein the value of the flip-flop 212 may be written by the test circuit 30 and the multiplexer 210 is configured to select either the signal received via the respective pad/pin PIN or the output signal of the respective flip-flop 212 (or directly a signal received from the test circuit 30). Finally, in order to monitor the signal NS generated by the combinational logic circuit 200, it is sufficient that the test circuit 30 generates the clock signal CLK, which permits that the test circuit 30 may read the content of the storage elements/flip-flops 202.

Conversely, concerning the combinational logic circuit 204, and taking into account that the test circuit 30 is already able to write and read the content of the storage elements/flip-flops 202, it is sufficient that the test circuit 30 may monitor/read the output signals OUT. For example, the test circuit 30 may monitor externally the signals at the pads/pins POUT, or the test circuit 30 may monitor internally the signals OUT. For example, in FIG. 2, the system comprises for each signal OUT a respective flip-flop 208 configured to store a respective signal OUT in response to the clock signal CLK. Accordingly, in order to monitor the signals OUT, it is sufficient that the test circuit 30 generates the clock signal CLK, which permits that the test circuit 30 may read the content of the flip-flop 208.

This basic testing of sequential logic circuits 20 may also be applied to more complex integrated circuits comprising a plurality of internal registers 202.

Figure 3:
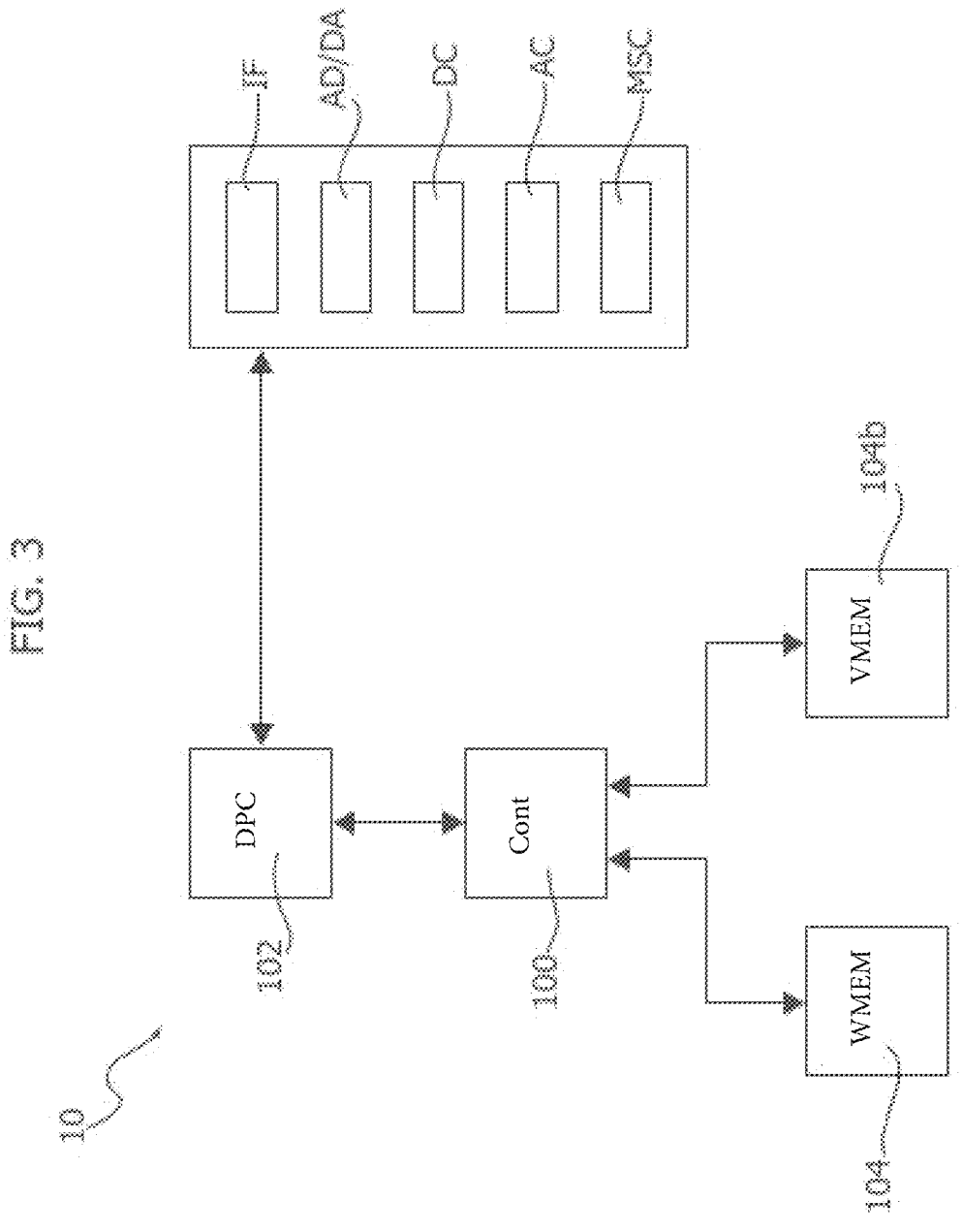
FIG. 3 shows an embodiment of processing system.

For example, FIG. 3 shows a block diagram of an embodiment of a processing system 10, such as a micro-controller.

In the embodiment considered, the processing system 10 comprises a digital processing circuit, such as a microprocessor (DPC) 102, usually the Central Processing Unit (CPU), programmed via software instructions. Usually, the software executed by the microprocessor 102 is stored in a non-volatile program memory (NMEM) 104, such as a Flash memory or EEPROM. Thus, the memory 104 is configured to store the firmware of the microprocessor 102, wherein the firmware includes the software instructions to be executed by the microprocessor 102. The microprocessor 102 usually has associated also a volatile memory (VMEM) 104*b*, such as a Random-Access-Memory (RAM). For example, the memory 104*b* may be used to store temporary data. As shown in FIG. 3, usually the communication with the memories 104 and/or 104*b* is performed via one or more memory controllers (Cont) 100. The memory controller(s) 100 may be integrated in the microprocessor 102 or connected to the microprocessor 102 via a communication channel, such as a system bus of the processing system 10. Similarly, the memories 104 and/or 104*b* may be integrated with the microprocessor 102 in a single integrated circuit, or the memories 104 and/or 104*b* may be in the form of a separate integrated circuit and connected to the microprocessor 102, e.g., via the traces of a printed circuit board.

The processing system 10 may comprise also one or more (hardware) resources/peripherals 106, e.g., selected from the group of:

one or more communication interfaces IF, e.g., for exchanging data via the communication system 20, such as a Universal asynchronous receiver/transmitter (UART), Serial Peripheral Interface Bus (SPI), Inter-Integrated Circuit (I²C), Controller Area Network (CAN) bus, and/or Ethernet interface; and/or
  one or more analog-to-digital converters AD and/or digital-to-analog converters DA; and/or
  one or more dedicated digital components DC, such as hardware timers and/or counters, or a cryptographic co-processor; and/or
  one or more analog components AC, such as comparators, sensors, such as a temperature sensor, etc.; and/or
  one or more mixed signal components MSC, such as a PWM (Pulse-Width Modulation) driver.

For example, in case of a micro-controller the resources/peripherals 106 are connected to the microprocessor 102 via a suitable communication system, such as one or more system buses.

Accordingly, each of the circuits 100, 102, and 106 may comprise one or more sequential logic circuits 20, which in turn comprises a plurality of registers. For example, the state registers 202 may comprise the instruction and special function registers of a microprocessor 102, or the registers used to interface the peripherals 106.

Figure 4:
FIG. 4 shows an embodiment of an integrated circuit comprising one or more chains of scan elements for a scan test and/or a boundary scan test.

FIG. 4 shows in this respect an embodiment of an integrated circuit 12 with an integrated test interface (testIF) 300.

Specifically, in the embodiment considered, the integrated circuit 12 comprises a processing system 10 and a plurality of pads/pins P. For example, in FIG. 4 are shown three input pads/pins P1, P2 and P3 and three output pads/pins P4, P5 and P6.

Accordingly, in order to test the processing system 10, a test circuit 30 should be able to: modify the signals received via the input pads/pins, e.g., pads/pins P1, P2 and P3; read and modify the content of the internal flip-flops 202 of the processing system 10; and read the content of the signals provided to the output pads/pins, e.g., pads/pins P4, P5 and P6.

For example, in an integrated circuit 12, the internal flip-flops 202 are controlled via a so called "scan test". Specifically, in this case the internal flip-flops 202 are connected in series, in order to form one or more chains of flip-flops. For example, in FIG. 4 are shown two chains 202*a* and 202*b*. For example, one or more (or each) of the circuits 100, 102 and 106 may be implemented with an intellectual property core, which comprises a respective chain of flip-flops. For example, such solutions are disclosed in U.S. Pat. Nos. 5,428,624, 8,996,939 or 8,745,456.

Figure 5:
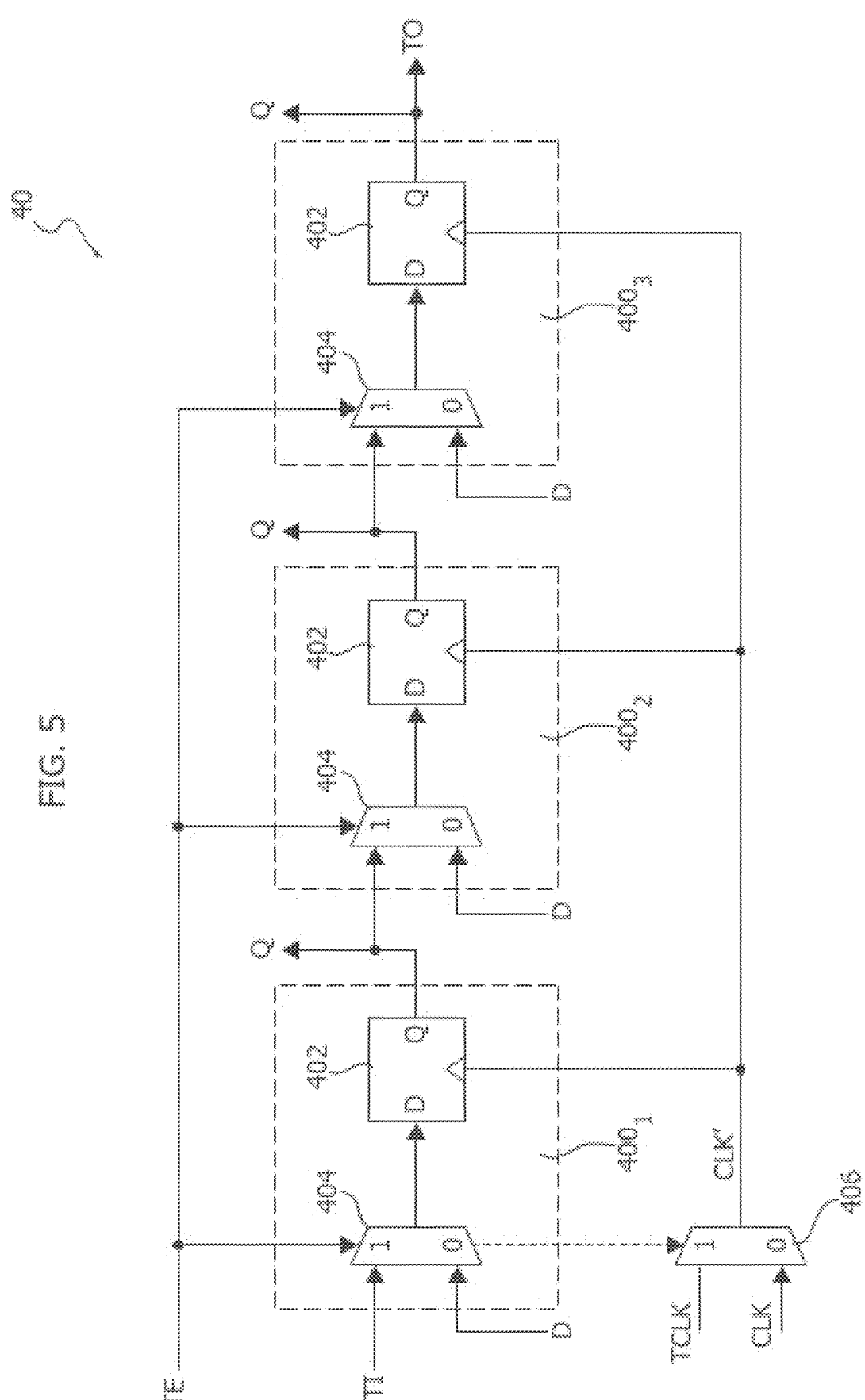
FIG. 5 shows an embodiment of a chain of scan elements.

For example, FIG. 5 shows an embodiment of a flip-flop chain 40, which may be used, e.g., for each of the chains 202*a* or 202*b*.

Specifically, in FIG. 5 are shown a plurality of flip flops 402, wherein each flip flop 402 receives a binary input signal D and provides a binary output signal Q, wherein each flip-flop 402 is configured to store the value of the input signal D in response to a clock signal.

Specifically, in the embodiment considered, each flip-flop 402 of a chain is modified to implement a scan-element 400. For example, in FIG. 5 are shown a first scan-element 400₁, a last scan element 400₃, and one or more intermediate scan-elements 400₂. Specifically, each scan-element 400 comprises in addition to the respective flip-flop 402, a respective multiplexer 404. Specifically, this multiplexer 404 is configured to receive a test-mode enable signal TE (often identified as scan enable signal) and apply to the input of the respective flip-flop 402 (when the test-mode enable signal TE has a first logic level, e.g., low) the respective original input signal D or (when the test-mode enable signal TE has a second logic level, e.g., high): in case of the first scan-element 400₁ of the chain, a serial data input signal TI (often identified as scan input signal); and in case of all following scan-elements 400 of the chain, e.g., elements 400₂ and 400₃, the signal at the output of the flip-flop 402 of the previous/up-stream scan-element 402.

Moreover, the output of the last scan-element 400₃ of the chain corresponds also to a serial data output signal TO (often identified as scan output signal).

Accordingly, by using such scan chains 40 in the embodiment shown in FIG. 4, the test circuit 30 may sequentially load data into a scan chain 202 by setting the respective test-mode enable signal TE to the second logic level, applying sequentially data to the serial signal TI of the scan chain and generating the clock signal for the flip-flops of the scan chain. Accordingly, once having loaded data into the scan elements, the respective flip flops provide respective output signals Q to the associated circuits. Moreover, the test circuit 30 may obtain the content of the scan chain 40 by reading the signal TO and generating the clock signal for the flip-flops of the scan chain.

For example, as schematically shown in FIG. 5, a clock signal CLK' for the flip-flops 402 may be generated via a multiplexer 406 configured to select the clock signal CLK of the processing system 10 when the test-mode signal has the first logic level, and a test clock signal TCLK (often identified as scan clock signal), e.g., provided by the test circuit 30, when the test-mode signal has the second logic level.

Generally, the scan-elements 400 may also be more complex, e.g., in order to sequentially preload the input data to further flip-flops and transfer the data from the preload flip-flops to the flip-flops 402 in response to a preload completion signal, thereby ensuring that the content of the flip-flops 402 is updated only once all bits of the signal TI have been loaded into the processing system 10.

Accordingly, when using a scan-test, the content of the flip-flops 202 of a sequential logic circuit of the integrated circuit 12 may be modified by loading sequentially a serial stream of data TI into a respective chain of flip-flops. Similarly, the content of a flip-flop 202 may be read by reading sequentially a serial stream of data TO from the respective chain of flip-flops.

For example, as shown in FIG. 4, in order to generate the serial signal TI and read the serial signal TO, the integrated circuit may comprise a Test Access Port (TAP) 300, e.g., a Joint Test Action Group (JTAG) TAP according to IEEE standard 1149.1. For example, in this case, the (external) test circuit 30 and the TAP port 300 of the integrated circuit 12 may exchange data via a serial data input signal TDI, a serial data output signal TDO and a clock signal TCLK. Typically, the communication may also use further signals, such as a test mode select (TMS) and a test reset (TRST), which are not shown in FIG. 4. Generally, while not shown in FIG. 4, the test port 300 may also generate further signals, such as the signal TE and/or the clock signal TCLK, which are shown in FIG. 5.

As described in the foregoing, in order to apply input signals to the processing system 10, the test circuit 30 may apply externally signals to the input pads/pin, or additionally circuits 206 may be added in order to set the input signals. Moreover, in order to read the output signals of the processing system 10, the test circuit 30 may read externally the signals provided via the output pads/pin, or additionally flip-flops 208 may be added, and the test circuit may read the content of these flip-flops 208.

For example, also the circuits 206 (shown in FIG. 2) may be replaced with scan-elements 400 connected in series (see FIG. 5), thereby generating an input scan chain 206, which permits to load the flip-flops 212/402 of the circuits 206 and optionally read the content of the flip-flops 212/402. Specifically, in this case, the original data signals D would be connected to the input signals received via the input pads/pins and the output signals of the flip-flops 402 would be connected to the processing system 10.

Similarly, also the flip-flops 208 may be replaced with scan-elements 400 connected in series (see FIG. 5), thereby generating an output scan chain 208, which permits to read the content of the flip-flops 208 and optionally load the flip-flops 208. Specifically, in this case, the original data signals D would be connected to the output signals of the processing system 10 and the output signals of the flip-flops 402 would be connected to the output pads/pins.

As shown in FIG. 4, often the input scan chain 206 and the output scan chain 208 may be connected in series, whereby a serial input data signal and a serial output data signal may be used to write and read both chains 206 and 208. Typically, the interaction with such flip-flops associated with the input and output pads/pins (or in general the input and output terminals of a more complex circuit) is identified as "boundary scan test". Generally, the chains 202, 206 and 208 may be controlled via the same test port 300 or via a plurality of test ports. Moreover, the chains 206 and/or 208 may also be integrated in the processing system 10 and already form part of the chains of flip-flops 202.

Thus, essentially in a scan test the content of the flip-flops is modified by a test circuit 30 in order to verify the correct operation of the flip flips and/or the combinational logic circuits of the integrated circuit. Such scan tests and boundary scan tests are well-known in the art. For example, reference can be made to the standard developed by the Joint Test Action Group (JTAG), such as IEEE standard 1149.1.

Figure 6:
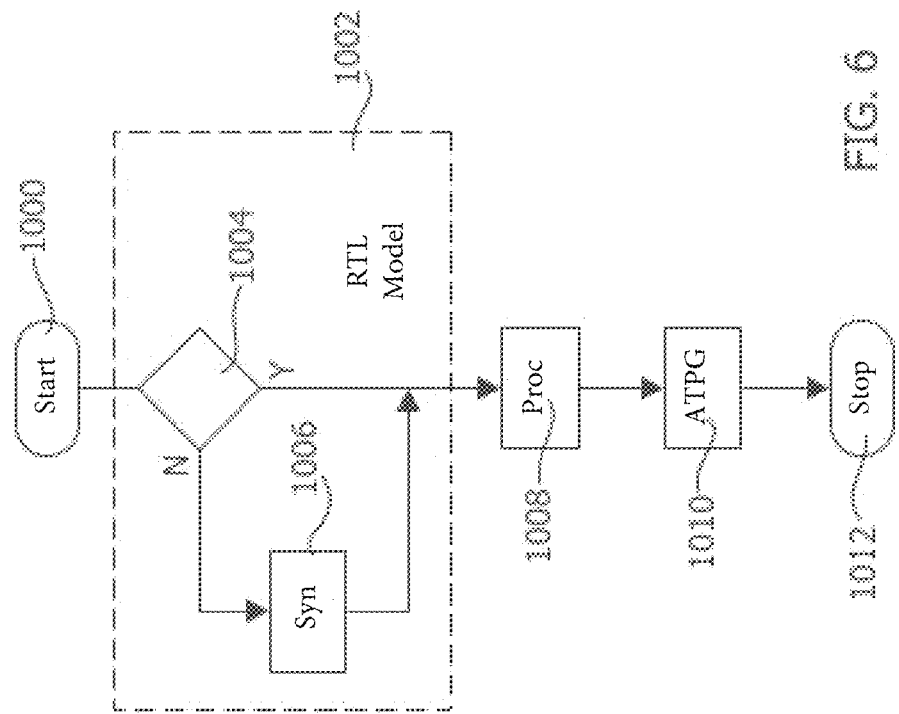
FIG. 6 shows an embodiment of a method for implementing a chain of scan elements in an integrated circuit.

As shown in FIG. 6, in various embodiments, the capability to perform a scan test and/or a boundary scan test is introduced automatically during the IC development stage, e.g., via a software application executed on a computer.

For example, after a start step 1000, a register-transfer level (RTL) model of the processing system 10 or a subcircuit thereof (e.g., circuit 100, 102 or 106) is obtained at a step 1002. In this respect, a digital circuit may already be described at RTL model (as schematically shown via an output "Y" of the step 1004) of may be provided via a higher language model, such as VHDL or VERILOG (as schematically shown via an output "N" of the step 1004). For example, RTL models may be provided for so called intellectual property (IP) cores, e.g., of the circuit 100, 102 or 106. Conversely, in case of a higher language model, usually the RTL model is generated via a synthesis (Syn) step 1006. Accordingly, once having obtained the RTL model, the software tool may process at a step 1008 (Proc) the RTL model, in particular in order to replace each flip-flop 202 with a respective scan-element 402 and connect the scan-elements 402 in series, thereby forming one or more chains of flip-flops 202 for the scan tests (see, e.g., FIG. 5). Additionally, or alternatively, the software tool may also add the chains 206 and 208 in order to permit a boundary scan test. The step 1008 is usually called "scan-insertion".

In general, the RTL model of an IP core may also already comprise chains of scan elements, i.e., the developers of the IP core may already implement the step 1008. In this case, the step 1008 may be omitted or the software tool may add the chains 206 and 208 in order to implement a boundary scan test.

Finally, the same software tool or a further software tool may be used to implement at a step 1010 an Automatic Test Pattern Generation (ATPG) for the bits to be loaded into the one or more chains of flip-flops, and the process stops at a stop step 1012. Substantially, such ATPG patterns are particular patterns generated by automatic tools in order to test the manufactured IC (die or packaged IC) in a test environment, i.e., when the IC 12 is connected to an Automated Test Equipment (ATE). Substantially, ATPG tries to find a test sequence that, when applied to a digital circuit, gives testers the ability to distinguish between correct and incorrect circuit behavior caused by functional anomalies.

Accordingly, as described in the foregoing, the digital circuits of modern integrated circuits 12 may be tested via a scan test and/or a boundary scan test. In this respect, as described with respect to FIG. 6, an RTL model of the digital circuits may be obtained during the development of the integrated circuit (step 1002). Specifically, due to the large number of flip-flops of modern integrated circuits, the chains of scan elements for such scan tests and/or boundary scan tests may be implemented automatically via a software tool (step 1008). Specifically, as described in the foregoing, such chains of scan elements may be implemented by: replacing the flip-flops of the RTL model with scan elements 400 connected in series in order to form one or more chains 202 adapted to be used for a scan test; and/or adding additional scan elements 400 at the input and/or output pads of RTL model in order to form chains 206 and/or 208 adapted to be used for a boundary scan test.

Moreover, an RTL model of a test port 300, such as a TAP, may be added in order to communicate with each chain of scan elements, in particular in order to provide a serial input data stream TI to the chain of scan elements and receive a serial output data stream TO from the chain of scan elements.

Accordingly, once the final RTL model of the digital circuits (with one or more chains of scan elements and the test port) has been obtained, the integrated circuit may be produced, e.g., via a physical synthesis of the RTL model based on a given selected technology and a physical production process of the integrated circuit layout, and the manufactured IC may be tested via an ATE (see step 1010). Specifically, during the scan test or scan mode, ATPG patterns are shifted inside the scan chains and/or boundary scan chains in order to test digital circuit correctness.

However, the inventors have observed that the data provided by the scan elements of such scan chains and/or boundary scan chains may also drive analog and/or digital circuits, which may work incorrectly when incorrect input data are provided. For example, as shown in FIG. 1, the digital input data IN provided to a digital circuit and/or the digital data STATE stored to the internal flip-flops 202 and/or the digital output data OUT may be used to drive a circuit 220, such as an analog circuit, e.g., including one or more power supplies, current or voltage regulators, ground switches, etc.

Accordingly, due to shift-in operation of the ATPG test patterns, also some signals may be toggled causing malfunctioning.

In prior-art solutions, such a problem is avoided by using scan elements, which comprise in addition to the flip-flops 402 forming the scan chain used to sequentially load data to the flip flops 402 and read data from the flip-flops 402, also a further flip-flop connected between the output of the respective 402 and the associated circuit. Specifically, the first flip-flop represents a pre-load flip-flop and the second flip-flop is enabled via a preload or update signal, whereby the flip-flops 402 of the chain 40 may first be loaded sequentially, and then the preload signal is set in order to transfer the content from the first flip-flops to the second flip-flops, which indeed drive the associated circuits. For example, such a solution is disclosed in United States U.S. Pat. No. 7,409,612.

The inventors have observed that such a solution is rather inefficient. For example, by using such more complex scan-elements during the automatic insertion of scan-elements, each flip-flop would be replaced with a respective scan element comprising two flip-flops, which significantly increases the complexity and cost of the integrated circuit. Moreover, also the ATPG phase has to be aware that each test pattern should comprise given values for specific scan elements 400.

Accordingly, in the following will now be described a different solution.

Figure 7:
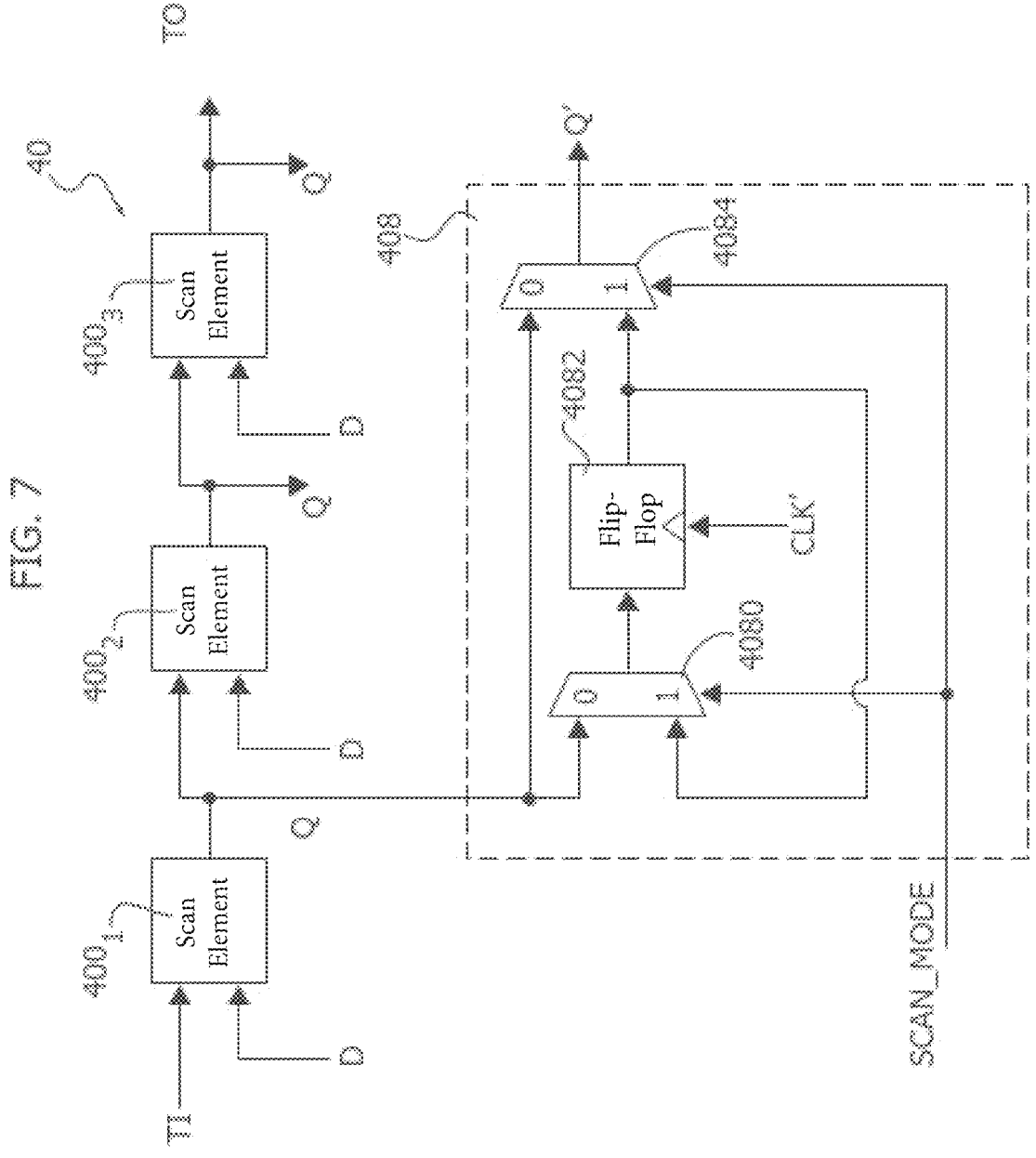

Specifically, FIG. 7 shows an embodiment, wherein a given signal Q provided by a scan element 400, in particularly the respective flip-flop 402, may be fixed to a given (and preferably programmable) value.

Specifically, FIG. 7 shows again a chain 40 of scan elements 400₁, 400₂ and 400₃, such as the scan elements of a scan chain and/or boundary scan chain. As described in the foregoing, each scan element 400 provides a respective binary output signal Q to an associated circuit, which may be an integrated digital circuit (such as the combinational logic circuits 200 and/or the combinational logic circuit 204) or a further (and possibly external) analog and/or digital circuit 220. As described in the foregoing, in various embodiments the values Q provided by the scan elements 400 may be programmed via: the respective signals D when the signal TE is de-asserted; and the signal TI when the signal TE is asserted.

Specifically, in the embodiment considered, at least one of the signals Q provided by the chain 40 of scan elements 400 has associated a storage circuit 408. For example, in FIG. 7, the signal Q provided by the scan element 400₁ has associated a storage circuit 408. However, in general, also other signals Q provided by the chain 40 and/or a plurality of signals Q may have associated respective storage circuits 408.

Specifically, in the embodiment considered, the storage circuit 408 receives the respective signal Q and also a control signal SCAN_MODE. Specifically, in response to determining that the signal SCAN_MODE is de-asserted and has a first logic level, e.g., "0", the storage circuit 408 operates in a transparent mode and provides the signal Q as signal Q'. Moreover, the storage element 408 stores the value of the signal Q. Conversely, in response to determining that the signal SCAN_MODE is asserted and has a second logic level, e.g., "1", the storage circuit 408 provides the stored value Q as signal Q'.

Figure 8:
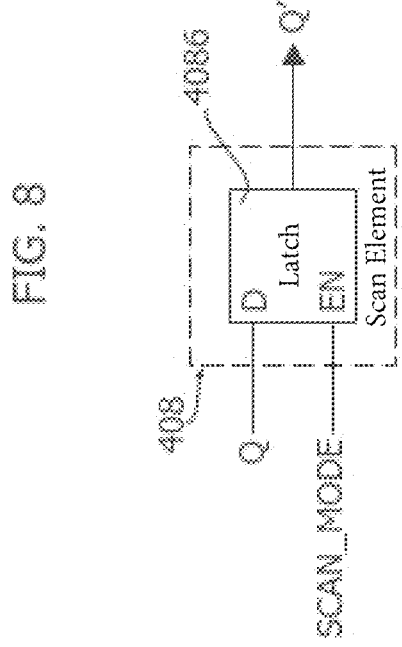
FIGS. 7, 8 and 9 shows embodiments of modified chains of scan elements.

For example, as shown in FIG. 8, in various embodiments, the storage element 408 may be implemented with an asynchronous latch. For example, in FIG. 8, the storage element 408 comprises a D-type latch 4086, wherein the signal Q is provided to a data input of the latch 4086, the signal SCAN_MODE is provided to an enable input of the latch 4086, and the latch 4086 provides the signal Q'. Accordingly, in the embodiment considered, when the signal SCAN_MODE is set to high/"1", the latch 4086 provides the signal Q and stores the signal Q, and when the signal SCAN_MODE is set to low/"0", the latch 4086 provides the stored signal Q.

Conversely, in FIG. 7, the storage element 408 comprises a synchronous flip-flop, such as a D-type flip-flop 4082. Specifically, in this case, the storage element 408, in particular the flip-flop 4082, is configured to store the signal Q when the signal SCAN_MODE has the first logic level, e.g., "0", and in response to a rising or falling edge of the clock signal, such as the clock signal CLK'.

For example, in the embodiment considered, the storage element 408 comprises a first multiplexer 4080 configured to provide to the input of the flip-flop 4082 the signal Q (when the signal SCAN_MODE has the first logic level, e.g., "0") or the signal stored by the flip-flop 4082 (when the signal SCAN_MODE has the second logic level, e.g., "1"). Moreover, the storage element 408 comprises a second multiplexer 4084 configured to provide the signal Q' by selecting the received signal Q (when the signal SCAN_MODE has the first logic level, e.g., "0") or the signal stored by the flip-flop 4082 (when the signal SCAN_MODE has the second logic level, e.g., "1").

Accordingly, in this way, the value of a given signal Q provided by a scan-element 400, in particular the respective flip-flop 402, may be programmed to a desired/requested value while the signal SCAN_MODE is set to the first logic level, e.g., "0", whereby the storage circuit 408 stores the respective signal Q and provides directly the received signal Q as signal Q' to the associated circuit (transparent mode). Next, once the signal SCAN_MODE is set to the second logic level, e.g., "1", the storage circuit 408 provides the stored value of the signal Q, thereby freezing the value of the signal Q'.

Accordingly, in various embodiments, the integrated circuit 12 uses two signals: a first signal SCAN_MODE and a second signal TE. Specifically, the first signal SCAN_MODE is used to indicate that the processing system 10 is in a test mode. For example, based on the specific implementation of the processing system, the test mode of the processing system 10 may be activated, e.g., via software instructions executed by a processing unit 102, via a test pin of the integrated circuit 12 or via the test port 300, or a combination thereof. Conversely, the signal TE is used to enable the writing (and reading) of the flip-flops 402 via the test port 300, e.g., by using the serial signals TI and the clock signal TCLK.

In fact, often modern processing systems 10, in particular microcontrollers, already use such a state signal SCAN_MODE in order to indicate that a test mode, such as a scan test and/or a boundary scan test, has been enabled. For example, in this case, the processing core 10 may initially be used during its normal operating mode (i.e., the signal SCAN_MODE is de-asserted). Accordingly, since the signal SCAN_MODE is de-asserted, the storage elements 408 operate in the transparent mode. Accordingly, in order to update the data stored to the storage elements 408, the processing system 10 may program the respective flip-flop 402 of the associated scan element, e.g., by using the normal operation of the sequential logic circuit based on the signals D. Specifically, since the scan/test mode is not activated, also the test port 300 usually cannot assert the signal TE, whereby the flip-flop 402 may be programmed only via the respective signal D, i.e., the state flip-flops 402 are programmed via the normal operation of the processing system 10, i.e., via the signals D. Next, the scan/test mode of the processing system 10 is activated, whereby the signal SCAN_MODE is asserted. Accordingly, once the signal SCAN_MODE is asserted, the storage element 408 provides the stored signal Q'.

Accordingly, at this point the test circuit 30 and the test port 300 may be used to sequentially load data into the scan elements 400 by using the signals TI and TE (while the signal SCAN_MODE is asserted/set to the second logic level).

Specifically, concerning the operation of the scan chain shown in FIG. 5, once the signal SCAN_MODE is asserted, the test port 300 may assert the scan mode enable signal TE and apply sequentially data to the serial input signal TI in order to load data into the flip-flops 402. Next, the test port 300 may de-assert the scan mode enable signal TE, whereby the sequential logic circuit 20 updates the content of the flip-flops 402. Accordingly, at this point, the test port 300 may again assert the scan mode enable signal TE, and sequentially read the serial output signal TO in order to read the content of the flip-flops 402, possibly also loading new data into the flip-flops 402. In such an arrangement, the multiplexer 406 shown in FIG. 5 is preferably not driven by the scan mode enable signal TE, but by the scan/test mode signal SCAN_MODE, whereby the flip-flops 402 receive the test clock signal TCLK when the scan/test mode is activated (i.e., the signal SCAN_MODE is asserted), irrespective of the actual value of the scan mode enable signal TE. For example, this permits to trigger the update of the content of the flip-flops 402 via the sequential logic circuit 20 via the test clock signal TCLK, e.g., in order to ensure that just a single state update is performed.

Accordingly, in the embodiment considered, the modifications of the state signals Q occurring during the loading of the serial input stream TI, the updating of the flip-flops 402 and the reading of the serial output stream TO are not stored by the storage elements 408, which still provide the previous values, because the scan/test mode signal SCAN_MODE remains asserted.

Accordingly, in the embodiment considered, the content of the storage elements 408 is programmed via the normal operation of the processing system 10, i.e., via the signals D (e.g., corresponding to the next state signal NS shown in FIG. 2), e.g., by executing software instructions on a microprocessor 102 and/or loading data from a memory, such as configuration data stored to a non-volatile memory 104, and the signal SCAN_MODE is used to maintain the already stored values.

Accordingly, in various embodiments, given flip-flops 402 of the RTL model obtained at the step 1002 are marked as protected, and the step 1008 may replace the flip-flops 402 with scan elements 400 and automatically add storage circuit 408 to the marked flip-flops 402. However, such an automatic replacement is usually not possible with conventional software tools.

For this reason, in various embodiments, the additional storage elements 408 are added already to the RTL model obtained at the step 1002, e.g., by manually adding the storage elements 408 to the RTL model 1002 or preferably by adding the storage elements 408 in the higher language model of the integrated circuit, which is then synthesized at the step 1006 into a RTL model. Specifically, in this case, the flip-flop 4082 of the storage elements 408 are marked as to be excluded from the scan chain(s), whereby the step 1008 does not replace the flip-flops 4082 with respective scan element 402, i.e., the software tool for automatically generating the scan chain(s) skips the (marked) flip-flops 4082, which are thus excluded for the scan chain(s). In fact, such a marking of flip-flops to be excluded during the insertion of scan elements is often supported by conventional software tools.

Figure 9:
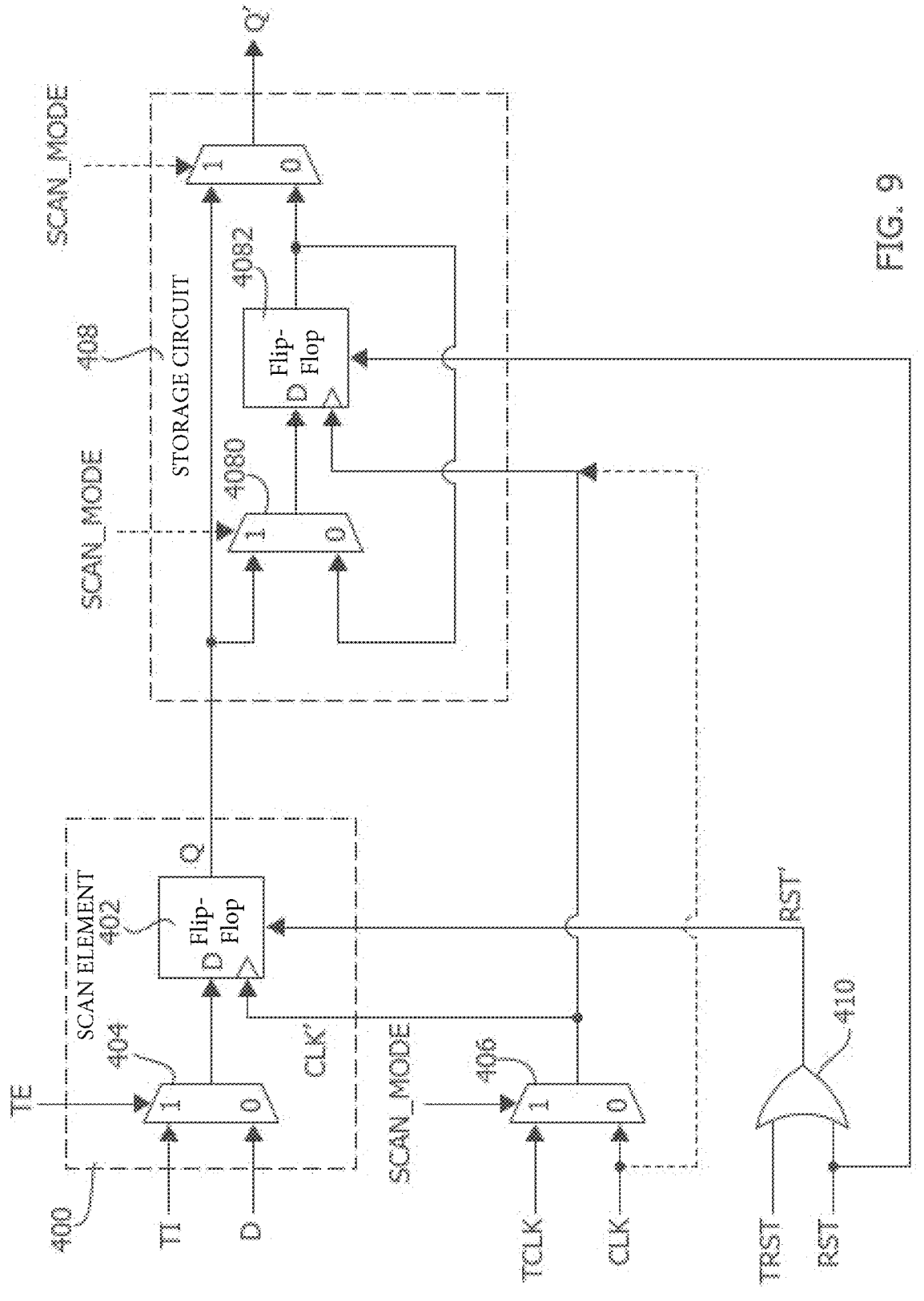

FIG. 9 shows a further embodiment of a scan element 400 with associated storage elements 408.

Specifically, in the embodiment considered, the flip-flops 402 of the scan elements 400 and the flip-flops 4082 of the storage elements 408 have a reset terminal, wherein the respective flip-flop is configured to reset its value to a given reset value, such as low, when a reset signal received at the reset terminal is asserted, e.g., is set to high.

Specifically, in a conventional integrated circuit, the processing system 10 uses a reset signal RST corresponding to the usual reset signal of an integrated circuit. For example, this reset signal RST may be generated by a reset management circuit in response to given events, such as a power on of the processing system as signaled via a power supply monitoring circuit, or given error events signaled by a fault collection and error management circuit. In case of a scan test, usually the test port generates also (in addition to the test clock signal TCLK) a test or scan reset signal TRST, which permits to reset the flip-flops of the scan chain(s) 40.

Accordingly, in the embodiments considered, the flip-flops 402 receive as reset signal a combined reset signal RST' which is asserted when any of the reset signal RST and/or the reset signal TRST is asserted. For example, the combined reset signal RST' may be generated via a combinational logic circuit 410, such as an OR gate, configured to: assert the combined reset signal RST' when the reset signal RST is asserted or the reset signal TRST is asserted; and de-assert the combined reset signal RST' when the reset signal RST is de-asserted and the reset signal TRST is de-asserted.

Conversely, in the embodiment considered, the flip-flops 4082 of the storage elements 408 receive as reset signal directly the reset signal RST, i.e., the flip-flops 4082 are not reset in response to the test reset signal TRST, whereby the flip-flops 4082 maintain their values also when a test reset is performed.

Moreover, as shown in FIG. 9, while the flip-flops 402 of the scan elements 400 receive the clock signal CLK', the flip-flops 4082 of the storage elements 4082 may receive: the clock signal CLK of the processing system 10, whereby the storage elements may be updated only via the normal operation of the processing system, e.g., via software instructions executed by a microprocessor 102; or the clock signal CLK'.

As mentioned before, the storage elements 408 may already be added to the RTL model of the respective circuit. For example, with respect to the storage element shown in FIG. 7, the flip-flop 4082 is marked as a storage element not to be replaced with a scan element, whereby the software tool is configured to execute at the step 1008 the following operations for each flip-flop of the obtained RTL model: determine whether the flip-flop is marked; in response to determining that the flip-flop is not marked, replace the respective flip-flop with a scan element; and in response to determining that the flip-flop is marked, do not replace the flip flop, i.e., inhibit a replacement of the respective flip-flop with a scan element.

Generally, the above operations apply to scan chains. Conversely, in case of boundary scan chains, such chains may be added (externally) to the RTL model, without modifying the internal structure of the RTL model.

In case the circuit is described with a higher language model, the marking of the flip-flops 4082 may already be performed in the higher language model and the synthesis operation at the step 1006 may maintain the marking indication also in the respective RTL model.

In this respect, concerning the storage element 408 shown in FIG. 7, preferably also the multiplexers 4080 and 4082 are identified as Designed For Test (DFT). For example, such an indication may be used in many synthesis programs, in order to indicate that the respective circuit should not be optimized by the logic synthesis operation.

Of course, without prejudice to the principle of the invention, the details of construction and the embodiments may vary widely with respect to what has been described and illustrated herein purely by way of example, without thereby departing from the scope of the present invention, as defined by the ensuing claims.

For example, while the previous description refers mainly to scan chains, the solutions disclosed herein may also be used with other test circuits of sequential logic circuits 20. For example, in various embodiments, also other test circuits 30 may be used to write (and optionally read) the content of internal registers 202 of the sequential logic circuit 30 and/or apply input signals IN to the sequential logic circuit (see FIG. 2). In this respect, at least one of the state signals is not provided directly to the associated circuit, e.g., the circuit 204 or 220 shown in FIG. 1, but a storage element 408 is used to provide a modified state signal to the respective circuit.

The claims are an integral part of the technical teaching of the disclosure provided herein.

The invention claimed is:

1. An integrated circuit, comprising:
   a sequential logic circuit comprising:
   a plurality of state flip-flops that provide a state signal of said sequential logic circuit, wherein each state flip-flop is configured to generate a state output signal by storing an input signal in response to a clock signal; and
   a next-state combinational logic circuit configured to generate said input signals for said plurality of state flip-flops as a function of said state output signals of said plurality of state flip-flops and at least one input signal;
   a circuit configured to change operation as a function of a subset of the state output signals provided by said plurality of state flip-flops;
   a test circuit configured, when a test mode signal is asserted, to write and read the content of said plurality of state flip-flops in order to test the operation of said sequential logic circuit; and
   a plurality of storage circuits, wherein each storage circuit is interposed between said circuit and a respective state output signal of said subset of state output signals, wherein each storage circuit is configured to receive the respective state output signal and provide a modified state signal to said circuit, and wherein each storage circuit:
   provides, when said test mode signal is de-asserted, the received state output signal in a transparent manner as the modified state signal to said circuit and stores the received state output signal to a storage element of said storage circuit as a stored state output signal; and
   inhibits, when said test mode signal is asserted, storage of the received state output signal to said storage element of said storage circuit and provides the stored state output signal as the modified state signal to said circuit;
   wherein a number of said storage circuits is smaller than a number of state flip-flops in said plurality of state flip-flops.

2. The integrated circuit according to claim 1, wherein said storage circuit comprises:
   a storage flip-flop configured to store, in response to said clock signal, the respective received state output signal when said test mode signal is de-asserted.

3. The integrated circuit according to claim 2, wherein said storage circuit comprises:
   a first multiplexer configured to generate an input signal of the respective storage flip-flop by selecting:
   the received state output signal when said test mode signal is de-asserted, and
   the output signal of said storage flip-flop when said test mode signal is asserted; and
   a second multiplexer configured to generate the modified state signal by selecting:
   the received state output signal when said test mode signal is de-asserted, and
   the output signal of said storage flip-flop when said test mode signal is asserted.

4. The integrated circuit according to claim 1, wherein said test circuit comprises a scan-chain, wherein each state flip-flop of said plurality of state flip-flops forms part of a respective scan element, wherein:

15 a first scan element is configured to provide a serial input signal to the input of the respective state flip-flop when a scan mode enable signal is asserted;

following scan elements are configured to provide the state output signal of the state flip-flop of a previous scan-element to the input of the respective state flip-flop when a scan mode enable signal is asserted; and wherein the state output signal of the state flip-flop of a last scan-element corresponds to a serial output signal.

5. The integrated circuit according to claim 4, wherein said test circuit comprises a test port, configured to:

assert said scan mode enable signal;

sequentially apply data to said serial input signal in order to load data into said plurality of state flip-flops;

de-assert said scan mode enable signal, whereby said sequential logic circuit updates the content of said plurality of state flip-flops;

assert said scan mode enable signal; and sequentially read said serial output signal in order to read the content of said plurality of state flip-flops.

6. The integrated circuit according to claim 5, wherein said test port is configured to generate the clock signal for said plurality of state flip-flops when said test mode signal is asserted.

7. The integrated circuit according to claim 5, wherein said test port is further configured to control a scan mode enable signal and a test clock signal independently to facilitate different testing modes.

8. The integrated circuit according to claim 4, wherein said scan-chain further comprises a plurality of intermediate scan elements between said first scan element and said last scan-element, wherein each intermediate scan element is configured to pass data serially from a previous scan element to a next scan element in said scan-chain.

9. The integrated circuit according to claim 1, wherein individual storage circuits within said processing system are selectively enabled and disabled based on power management requirements of said circuit.

10. The integrated circuit according to claim 1, wherein said storage circuit further comprises a reset terminal configured to reset said storage element to a predetermined state in response to a reset signal.

11. The integrated circuit according to claim 1, wherein said next-state combinational logic circuit is configured to generate said input signals based on external input signals received at input pads of said integrated circuit.

12. The integrated circuit according to claim 1, wherein said storage element comprises a latch circuit configured to maintain said stored state output signal during said test mode.

13. The integrated circuit according to claim 1, wherein said circuit configured to change operation comprises a digital circuit that modifies its logic function based on said modified state signals.

14. The integrated circuit according to claim 1, wherein said test circuit is further configured to generate boundary scan test patterns for testing interconnections between said integrated circuit and external components.

15. An integrated circuit, comprising:

a sequential logic circuit comprising:

a plurality of state flip-flops that provide a state signal of said sequential logic circuit, wherein each state flip-flop is configured to generate a state output signal by storing an input signal in response to a clock signal; and a next-state combinational logic circuit configured to generate said input signals for said plurality of state flip-flops as a function of said state output signals of said plurality of state flip-flops and at least one input signal;

a circuit configured to change operation as a function of a subset of the state output signals provided by said plurality of state flip-flops;

a test circuit configured, when a test mode signal is asserted, to write and read the content of said plurality of state flip-flops in order to test the operation of said sequential logic circuit; and a storage circuit interposed between said circuit and a respective state output signal of said subset of state output signals, wherein each storage circuit is configured to receive the respective state output signal and provide a modified state signal to said circuit, and wherein each storage circuit:

provides, when said test mode signal is de-asserted, the received state output signal in a transparent manner as the modified state signal to said circuit and stores the received state output signal to a storage element of said storage circuit as a stored state output signal; and inhibits, when said test mode signal is asserted, storage of the received state output signal to said storage element of said storage circuit and provides the stored state output signal as the modified state signal to said circuit;

wherein said circuit comprises an analog circuit configured to change operation as a function of said modified state signals.

16. The integrated circuit according to claim 15, wherein said analog circuit comprises at least one of: a power supply, a current or voltage regulator, and a ground switch.

17. The integrated circuit according to claim 15, wherein said storage circuit comprises:

a storage flip-flop configured to store, in response to said clock signal, the respective received state output signal when said test mode signal is de-asserted.

18. The integrated circuit according to claim 17, wherein said storage circuit comprises:

a first multiplexer configured to generate an input signal of the respective storage flip-flop by selecting:

the received state output signal when said test mode signal is de-asserted, and the output signal of said storage flip-flop when said test mode signal is asserted; and a second multiplexer configured to generate the modified state signal by selecting:

the received state output signal when said test mode signal is de-asserted, and the output signal of said storage flip-flop when said test mode signal is asserted.

19. The integrated circuit according to claim 15, wherein said test circuit comprises a scan-chain, wherein each state flip-flop of said plurality of state flip-flops forms part of a respective scan element, wherein:

a first scan element is configured to provide a serial input signal to the input of the respective state flip-flop when a scan mode enable signal is asserted;

following scan elements are configured to provide the state output signal of the state flip-flop of a previous scan-element to the input of the respective state flip-flop when a scan mode enable signal is asserted; and wherein the state output signal of the state flip-flop of a last scan-element corresponds to a serial output signal.

20. The integrated circuit according to claim 19, wherein said test circuit comprises a test port, configured to:

assert said scan mode enable signal;

sequentially apply data to said serial input signal in order to load data into said plurality of state flip-flops;

de-assert said scan mode enable signal, whereby said sequential logic circuit updates the content of said plurality of state flip-flops;

assert said scan mode enable signal; and sequentially read said serial output signal in order to read the content of said plurality of state flip-flops.

21. The integrated circuit according to claim 20, wherein said test port is configured to generate the clock signal for said plurality of state flip-flops when said test mode signal is asserted.

22. The integrated circuit according to claim 20, wherein said test port is further configured to control a scan mode enable signal and a test clock signal independently to facilitate different testing modes.

23. The integrated circuit according to claim 19, wherein said scan-chain further comprises a plurality of intermediate scan elements between said first scan element and said last scan-element, wherein each intermediate scan element is configured to pass data serially from a previous scan element to a next scan element in said scan-chain.

24. The integrated circuit according to claim 15, wherein said test circuit is further configured to generate boundary scan test patterns for testing interconnections between said integrated circuit and external components.

\* \* \* \* \*